(12) United States Patent
Napolitano

(10) Patent No.: US 7,284,173 B2
(45) Date of Patent: Oct. 16, 2007

(54) BUILT-IN SELF-TEST CIRCUIT FOR PHASE LOCKED LOOPS, TEST METHOD AND COMPUTER PROGRAM PRODUCT THEREFOR

(75) Inventor: Leonardo Napolitano, Palma Campania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 309 days.

(21) Appl. No.: 10/841,981

(22) Filed: May 7, 2004

(65) Prior Publication Data
US 2005/0005215 A1  Jan. 6, 2005

(30) Foreign Application Priority Data
May 7, 2003 (EP) .................................. 03010239

(51) Int. Cl.
*G01R 31/3187* (2006.01)
*G01R 31/3167* (2006.01)

(52) U.S. Cl. ........................................ 714/726; 714/731
(58) Field of Classification Search ................ 714/726, 714/731, 700, 725, 733, 736, 814, 819, 30; 365/200
See application file for complete search history.

(56) References Cited

U.S. PATENT DOCUMENTS

| | | | |
|---|---|---|---|
| 5,663,991 A | 9/1997 | Kelkar et al. ................ | 375/376 |
| 5,912,901 A | 6/1999 | Adams et al. ............. | 371/22.5 |
| 6,246,618 B1 * | 6/2001 | Yamamoto et al. ......... | 365/200 |
| 6,253,284 B1 * | 6/2001 | Hsu ........................... | 711/115 |
| 6,294,935 B1 | 9/2001 | Ott .............................. | 327/150 |
| 6,396,889 B1 | 5/2002 | Sunter et al. ................ | 375/376 |
| 6,779,144 B2 * | 8/2004 | Hayashi et al. ............. | 714/731 |
| 2001/0054166 A1 | 12/2001 | Fukuda ........................ | 714/733 |

OTHER PUBLICATIONS

Sunter et al., Bist for Phase-Locked Loops in Digital Applications, Proceedings International Test Conference 1999, ITC' 99, Atlantic City, NJ, Sep. 28-30, 1999, International Test Conference, New York, IEEE, US, vol. Conf. Sep. 30, 1999, pp. 532-540, XP000928868.

* cited by examiner

*Primary Examiner*—Cynthia Britt
*Assistant Examiner*—Dipakkumar Gandhi
(74) *Attorney, Agent, or Firm*—Lisa K. Jorgenson; Allen, Dyer, Doppelt, Milbrath & Gilchrist, P.A.

(57) ABSTRACT

A built-in self-test circuit for phase locked loops includes a measurement circuit for measuring outputs of the phase locked loops, and receiving as inputs a plurality of external test signals. At least one module includes a scan chain for storing the test signals for programming the phase locked loops and the measurement circuit.

31 Claims, 3 Drawing Sheets

BUILT-IN SELF-TEST CIRCUIT FOR PHASE LOCKED LOOPS, TEST METHOD AND COMPUTER PROGRAM PRODUCT THEREFOR

FIELD OF THE INVENTION

The present invention relates to built-in self-test techniques for testing key analog parameters of phase locked loops (PLLs) and frequency synthesizers (FSs) including PLLs. However, this specific application is not to be construed in a limiting sense with respect to the scope of the invention.

BACKGROUND OF THE INVENTION

Phase locked loops are an essential building block of most digital and mixed-signal integrated circuits. Much effort has been dedicated to develop a testing technique for phase locked loops in integrated circuits.

Various testing techniques are known. For instance, testing techniques may operate through a synchronous digital tester or mixed-signal tester. Such techniques may be complex to program, require high precision in on-the-fly timing changes, and involve significant test times. These difficulties often reduce the testing operation to a simple check that a PLL is able to achieve phase lock.

Built-in self-test (BIST) techniques are also generally known that make use of on-chip digital test circuitry, implemented in the typical digital ASIC design flow, i.e., design capture at the register transfer level in an HDL (Hardware Design Language), followed by logic synthesis and automatic layout. The test circuitry usually comprises a gated binary counter for measuring the phase of the PLL with respect to a known frequency. The measurements are then transferred to a tool external to the chip for analysis. A test access port (TAP) is used for test control and observation of measurement results. Such control and observation functions can be performed for instance through a personal computer connected through its parallel port.

Scan based built-in self-test is an important technique for testing large and complex circuits. The scan-based BIST schemes, which rely on scan design for testability, use linear feedback shift registers (LFSRs) as pseudo-random pattern generators, and employ multiple-input shift registers (MISRs) as test response compactors. In scan based BIST the generators shift the sequences into the scan chains serially. By "scan chain" a serial organization of scan elements is meant wherein the first element of the chain is at a device input and the last element of the chain is at a device output. Devices may use single or multiple scan chains to capture all of the scannable nodes.

BIST techniques and circuitry examples are described for instance in the publication "BIST for Phase-Locked Loops in Digital Applications", S. Sunter and A. Roy, ITC International Test Conference Proceedings 199, p. 532.

Virtually all structural logic test methods, and BIST techniques in particular, are based on a full scan infrastructure. That is, all storage elements (flip-flops or latches) are connected together to form several scan chains so that in a test mode, data can be serially scanned into and out of these storage elements. Applying a test pattern includes scanning the pattern data, applying one or more functional clock cycles, and then scanning out the captured response data.

The problems that arise when testing PLLs through BIST techniques are essentially due to difficulties in generating the stimulus to run the BIST test approaches. So far, the following steps are generally followed: programming the TAP with a parallel scan mode instruction; re-programming the TAP with an instruction to assert a signal indicating the BIST testing of PLL (i.e., asserting a tst_pllbist signal), then the counter counts; waiting for the counter to stabilize; sending a pulse to the counter reset pin to bring to zero the counter; waiting a few milliseconds for the counter to count; and re-programming the TAP with a parallel scan mode instruction to close the counter gate.

Such a sequence for stimulus generation is quite complicated even if software features as macrotest/pattern mapping can be used to generate a WGL (Waveform Generation Language) file which contains the scan chain load of the values necessary to program the PLLs, followed by a scan chain unload of the expected values in the counters.

Further, this approach has an appreciable likelihood of being affected by errors. There is no mechanism, indeed, that may prevent the programmed PLL values from changing. Thus, if the same clock signal is used to clock both the PLL and the logic surrounding it, the programmed value could get corrupted.

Additionally, the PLL operating period during the test is not very accurate since it is determined by programming the TAP port with a different instruction from the run test instruction (Runbist instruction), so that the occurrence of the deassertion of the test signal (i.e., tst_pllbist signal de-asserted) closing the measurement window is not very clear.

SUMMARY OF THE INVENTION

In view of the foregoing background, an object of the present invention is to provide a built-in self-test circuit that allows phase locked loops to be tested with the same stimulus, thus avoiding data corruption.

This and other objects, advantages and features in accordance with the present invention are provided by a built-in self-test circuit for a phase locked loop comprising a measurement counter for measuring an output of the phase locked loop and receiving as inputs a plurality of external test signals, and at least one module comprising a scan chain for storing the external test signals for programming the phase locked loop and the measurement counter.

The invention also relates to a corresponding testing method, as well as to a computer program product directly loadable in the memory of a computer and comprising software code for performing the method of the invention when the product is run on the computer.

In particular, the approach according to the invention provides a built-in self-test circuit that associates scan chains to the measure circuit control modules equipped with registers for containing the scan chains. In comparison with prior art arrangements, the arrangement disclosed herein allows testing of PLLs at the same time, with the same stimulus, thus avoiding data corruption. Additionally, the built-in self-test circuit is fully programmable and independent of the PLL clock frequency.

BRIEF DESCRIPTION OF THE DRAWINGS

The present invention will now be described, purely by way of a non-limiting example, with reference to the annexed drawings, wherein.

DETAILED DESCRIPTION OF THE PREFERRED EMBODIMENTS

Figure 1:
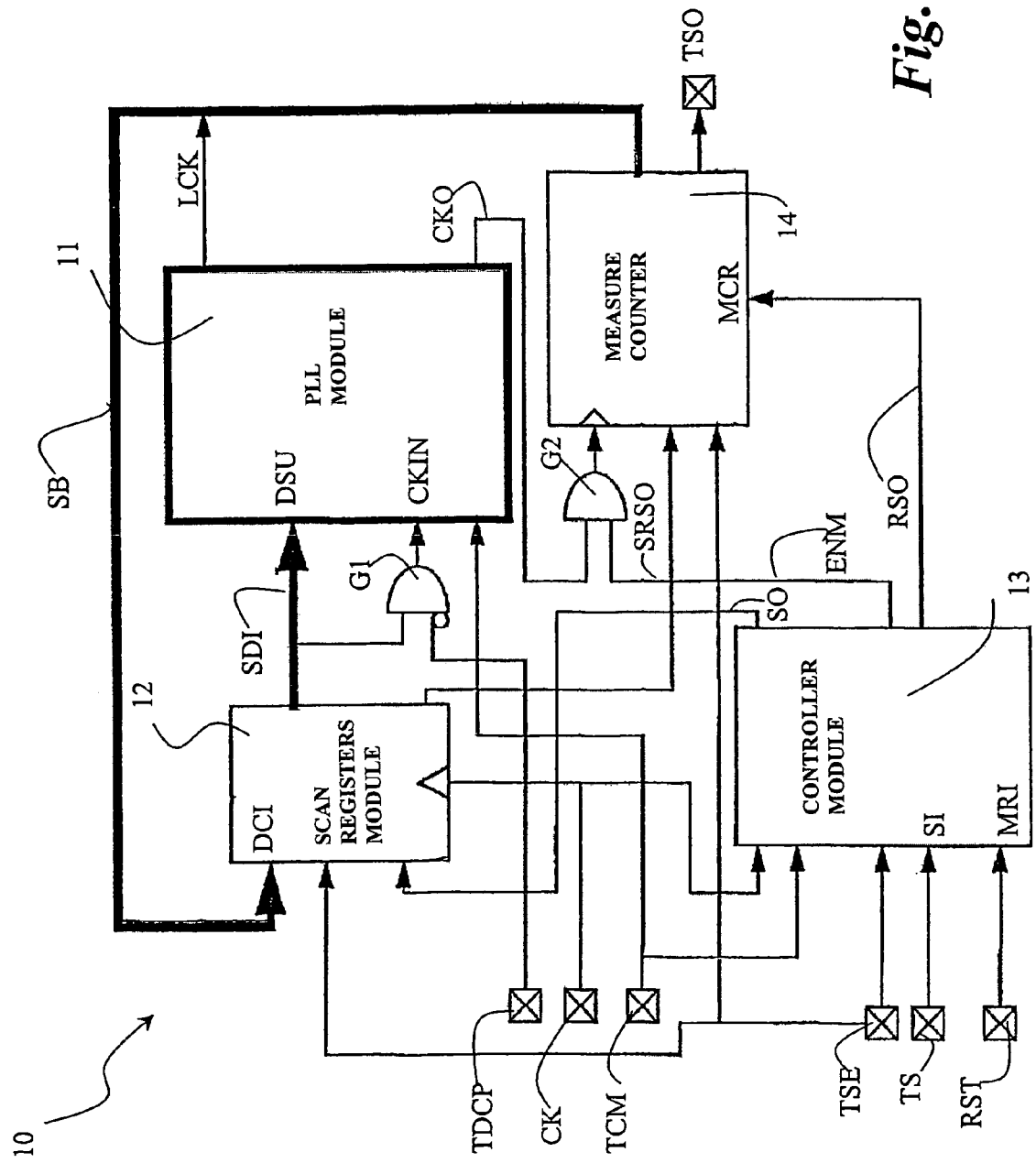
FIG. 1 is a block diagram of a built-in self-test circuit according to the invention.

FIG. 1 shows a built-in self-test circuit 10 for phase locked loops. A block indicated with the reference number 11 represents a PLL module to be tested. The self-test circuit 10 comprises a block 12 representing a scan registers module that supplies a setup data signal SDI to the PLL module 11. The scan registers module 12 comprises a scan chain equipped with the necessary number of flip-flops for programming such a PLL module 11.

A block 13 represents a controller module. The controller module 13 comprises logic circuits, a 21 bit scannable synchronous counter and a scan chain for programming the maximum PLL lock time expected from the PLL under test and the PLL measurement time. It is possible to set a safety time that will ensure locking of the PLL on the frequency programmed through the PLL parameters.

In the illustrated embodiment, just three scan flip-flops are connected to the scan chain to allow the desired lock time to be loaded. For example, it is possible to choose to wait either 38.4 ms, 19.2 ms, 9.6 ms, 4.8 ms, 2.4 ms or 1.2 ms (with the clock frequency input being fixed to 27 MHz) before starting to observe the PLL clock output, while the PLL measurement time is set in a range which goes from 0 to 77.6 ms (with the clock frequency input being fixed to 27 MHz). However, this range could be extended if needed. If the maximum lock time allowed is not sufficient to lock some type of PLL or frequency synthesizer, it is always possible to add other flip-flops to the control scannable counter. For each flip-flop added to the scannable counter, the maximum lock time is doubled.

The self-test circuit 10 further comprises a block 14 representing a measure counter. The measure counter is a 32 bit counter that operates on the output of the PLL module 11 to measure the parameters under test. FIG. 1 also shows a plurality of signals supplied from external the chip through the TAP port to the built-in self-test circuit 10.

The plurality of external signals comprise a reset signal RST, a test scan signal TS, a test scan enable signal TSE, a test clock macro signal TCM, a clock input CK, and a test dc path off signal TDCP. The function of these signals will be detailed below when referring to the test sequence.

The controller module 13 comprises a main reset input MRI receiving the reset signal RST, and a scan input SI receiving test scan signal TS. The controller module 13 also receives the test scan enable signal TSE, the test clock macro signal TCM and clock signal CK. The controller module 13 then produces as outputs an enable measure signal ENM, a reset signal RSO, and a scan out signal SO.

The measure counter 14 comprises a reset input MCR receiving a reset signal RSO from the controller module 13. The measure counter 14 also receives the test scan enable signal TSE and a scan out signal SRSO issued by the scan registers module 12. The measure counter 14 receives at its clock input the output of a logical gate G2 performing an AND operation between the enable measure signal ENM and an output clock signal CKO issued by the PLL module 11. The measure counter 14 is also connected to a signature bus SB and supplies as output a test scan out signal TSO on a signal pin that can be externally accessed.

The scan registers module 12 receives at its clock input the external clock signal CK, and also receives the test scan enable signal TSE and the scan out signal SO issued by the controller module 13. The scan registers module 12 receives at a data capture input DCI the signature bus SB, while issuing a setup data signal SDI to the PLL module 11.

As already mentioned above, the scan registers module 12 also outputs the scan out signal SRSO to the measure counter 14. Finally, the PLL module 11 is equipped with an enable input EN, a clock input CKIN receiving the test clock macro signal TCM, and a data setup input DSU receiving the setup data signal SDI. The PLL module 11 supplies as outputs a locked signal LCK, along with an output clock signal CKO.

The signature bus SB connects the measure counter 14 and the scan registers module 12. The locked signal LCK of the PLL module 11 is inserted on the signature bus SB so that the locked signal LCK is supplied both to the measure counter 14 for measurement and to the data capture input DCI of the scan registers module 12 for capturing the signature at the end of the measurement.

The test dc path off signal TDCP, which comes from the external TAP, is fed to the inverting input of a logical gate G1 performing an AND operation with the setup data signal SDI. The output of the logical gate G1 drives the enable input EN of the PLL module 11 to disable the PLL module 11 when it is necessary for an IDDQ (quiescent supply current) measurement.

With the above described arrangement there is no need to devote a set of scannable flip-flops to capture the signature (measure counter value) at the end of the measurement phase. The scan registers module 12 accomplishes such a task by a sub-set of flip-flops used to load the data onto the PLL module 11. Operation of the PLLs is fully under the control of programmers. They only have to generate the right macrotest/pat mapping file, which will allow programming of all the PLL operations.

Figure 2:
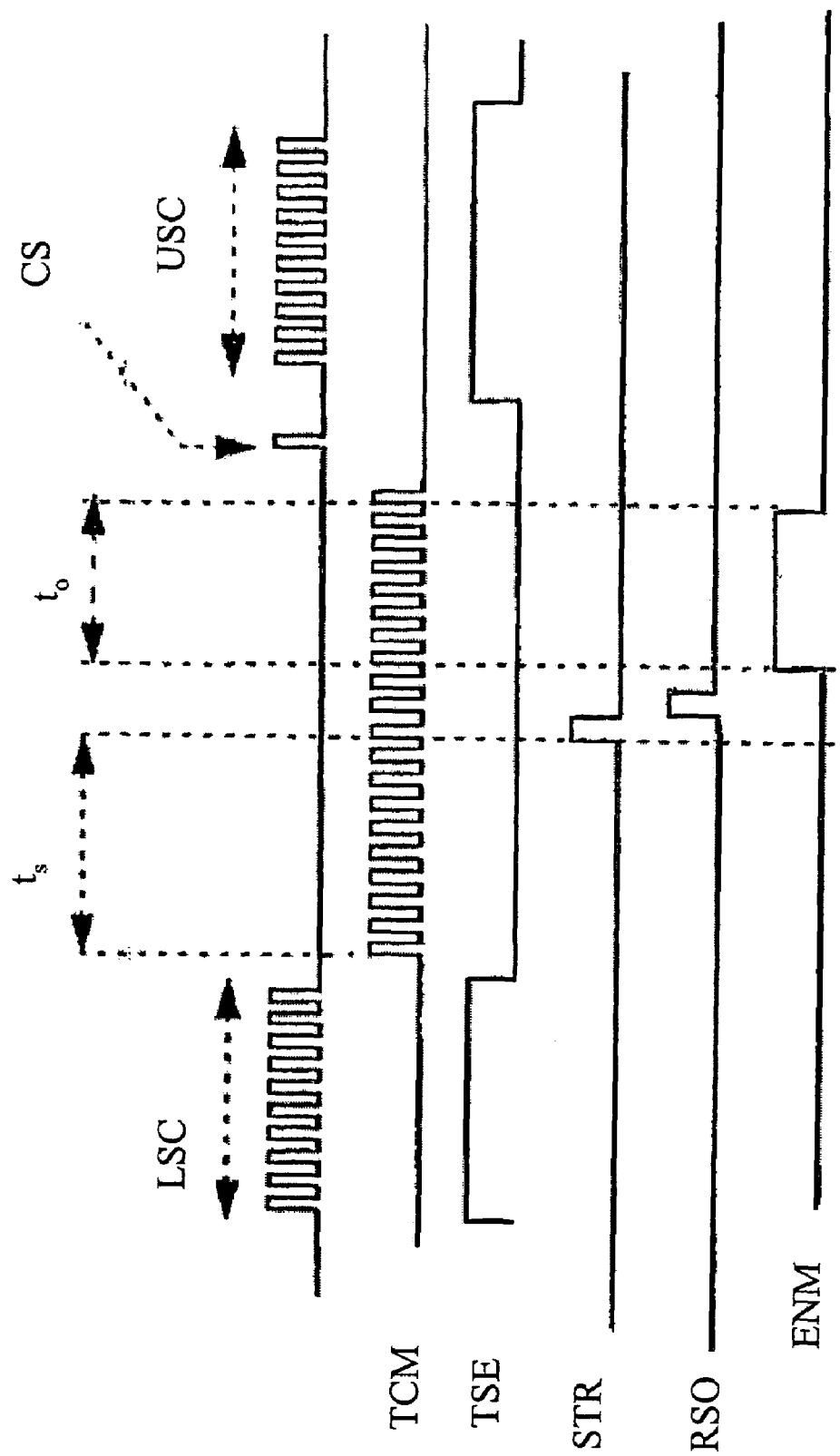
FIG. 2 represents a timing diagram of signals associated with the built-in self-test circuit as shown in FIG. 1.

FIG. 2 represents a timing diagram of the most significant signals in the built-in self-test circuit 10. The clock signal CK comprises pulses representing a load scan chain LSC, a capture signature signal CS that enables capture in an MISR register in the scan registers module 12, and an unload scan chain USC. The test clock macro signal TCM clocks the operation of the PLL module 11. The test scan enable signal TSE enables scan chain operations in the circuit 10 when its value is high. There is a strobe signal STR, and the enable measure signal ENM issued by the controller module 13 and is controlled by the measurement window of measure counter 12. The strobe signal STR is an internal signal that has been shown in order to better explain operation of the built-in test circuit 10.

FIG. 2 also shows the setup period $t_s$ and the operating period $t_o$ of the PLL. The setup period $t_s$ is triggered by the test clock macro signal TCM and terminated by the strobe signal STR, while the reset signal RSO triggers the operate period $t_o$. The test clock macro signal TCM waveform shown in FIG. 2 can be easily expanded by using the tester's LOOP command. The measure counter 14 is a scannable 32 bits synchronous counter, which allows counting of a maximum of $4.29 \times 10^9$ clock pulses. The test sequence of the built-in self-test circuit 10 will now be detailed. The test sequence comprises the following operations.

PLL programming: to program the PLL module 11, the clock signal CK is operated, through load scan chain LSC pulses, to load in the PLL module 11 the scan chain with the PLL data set up, i.e., the data to put on PLL inputs and the data for programming the test (expected PLL lock time and the PLL operate time which is the PLL test time) that corresponds to the data set up signal SDI.

PLL locking: to lock the PLL module 11, after the scan chain is loaded, the scan enable signal TSE goes low and the test clock macro signal TCM is operated to clock both the PLL module 11 and the PLL control counter in the controller module 13. The PLL control counter is set, through the scan chain, for issuing the strobe signal STR after it has been clocked n number of times (where n is the safety margin for ensuring locking of the PLL). As can be easily seen from FIG. 2, the number n of pulses corresponds to the setup time $t_s$. It must also be observed that in this stage the PLL control counter is used as a setup counter in order to wait for PLL the lock time.

PLL operating: when the PLL control counter issues its strobe signal STR, that means the PLL module 11 has been clocked enough times to be locked. The strobe signal STR will activate the reset signals, resetting both the control counter and the measure counter 14 through the reset input MCR receiving the reset signal RSO from the controller module 13. The controller 13 also enables the PLL measure counter 14 clock input to get the data from the PLL module 11 clock output CKO, which results in the enable measure signal EN going high. After this, the PLL module 11 is clocked m times, where m is the number of test clock macro signal TCM pulses with which is desired to operate the PLL module 11. The number m is related to the number that is expected in the PLL measure counter 14 at the end of the test.

Signature capturing: when the control counter in the controller module 13 reaches the last programmed pulse of the test clock macro signal TCM, the enable measure signal ENM goes low. This allows for blocking the value inside the measure counter 14 before capturing such a value as a signature, so that the measure counter 14 is safe with respect to over-clocking. Then, in the next clock cycle, the test clock macro signal TCM sequence is followed by the capture clock or capture signature CS signal, i.e., the clock CK is pulsed once, and the data contained at that time inside the measure counter 14 is captured to a MISR register. This is a subset of the scan chain register in the scan registers module 12.

Signature unloading: when the test scan enable signal TSE goes high, the clock CK is operated in order to shift out of the chip the captured signature to allow that data to be compared with the expected data.

When expanding the test clock macro signal TCM pulses, at least two more test clock macro signal pulses have to be added to allow the reset operation between the lock stage and the measurement stage. The above test sequence is obtained through an ATPG (Automatic Test Pattern Generation) tool, so the PLL test is sent like any other scan test, i.e., like a pattern file.

Figure 3:
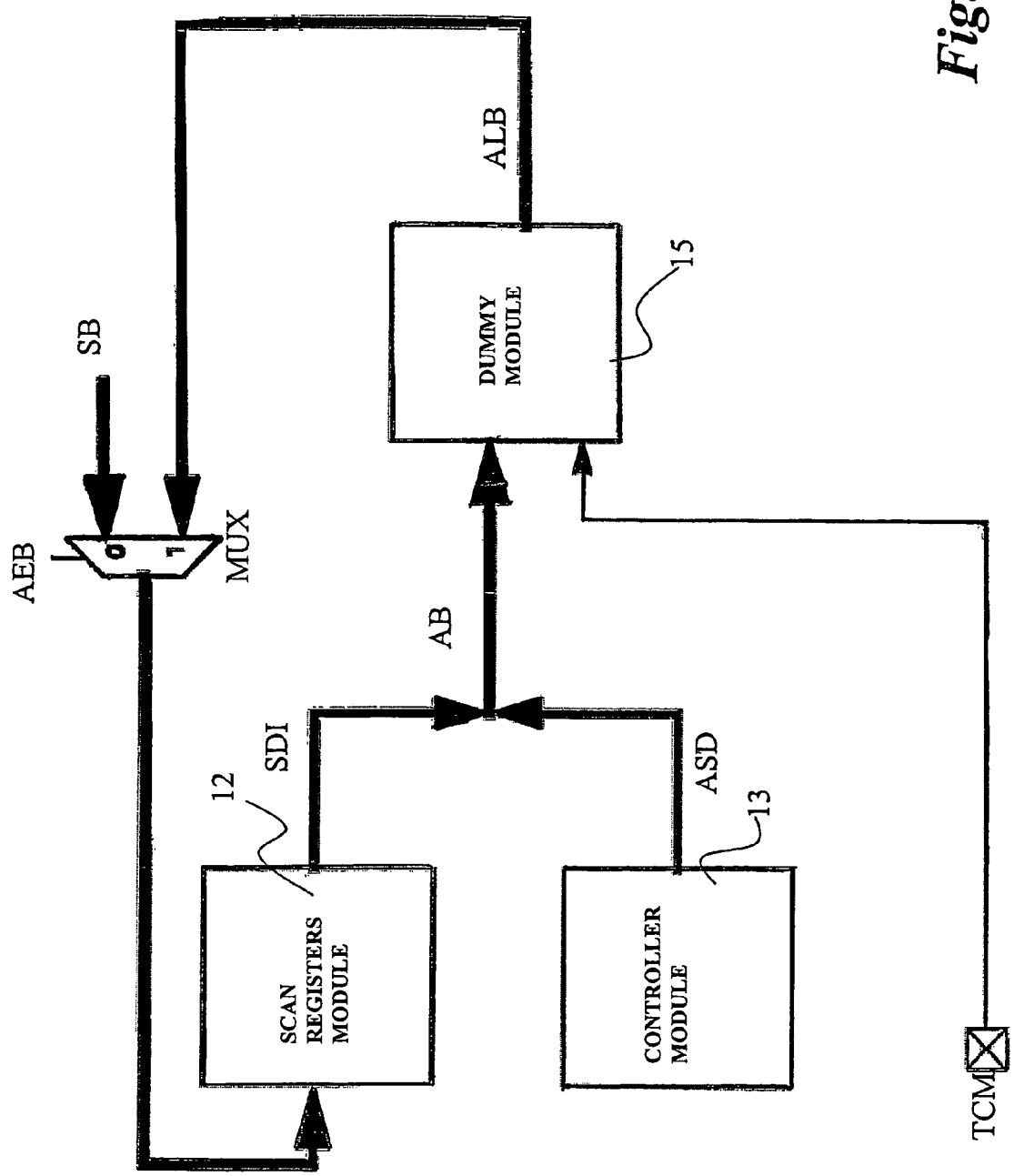
FIG. 3 is a block diagram of a circuit operating in association with the built-in self-test circuit according to the invention.

To allow the ATPG tool, by way of example, a Synopsys TetraMax ATPG tool, to generate the patterns just supplying both the desired data setup and the expected data, an empty dummy module 15 as shown in FIG. 3 is introduced. It must be specified that some ATPG tools, like Mentor FastScan ATPG tool, implement a more sophisticated Macrotest feature that does not require such a dummy module 15. The dummy module 15 allows the setup data to be put on an ATPG bus AB and it is expected that the measurement results are put on an ATPG LFSR bus indicated with reference ALB.

The ATPG buses AB and ALB and the dummy module 15 are supplied only for operating with the ATPG tool, so they will not appear in the final circuit on silicon. The controller module 13 is to be equipped with an additional ATPG output bus ASD just for pattern generation and is connected to the scannable flip-flops of such a controller module 13. This permits programming of both the setup time tS to wait for PLL lock and the PLL measurement time. The ATPG LFSR bus ALB is sent together with the signature bus SB to a multiplexer MUX controlled by an ATPG LFSR enable signal AEB, that is, set to 1 for pattern generation.

In this way the only information items that be supplied to the ATPG tool to generate the patterns are the value to put on the ATPG bus ABD and the value to expect on ATPG LFSR bus ALB. Then the ATPG tool will be able to generate patterns able to load the correct data into the flip-flops.

The arrangements disclosed herein achieve notable advantages over the known approaches. The proposed built self-test circuit allows for testing several PLLs and frequency synthesizers at the same time with the same stimulus, since the proposed circuit allows over-clocking without data corruption.

A further advantage of the proposed approach resides in that the test interface is based on a minimal set of standard scan test signals. The same test interface is used regardless of the type of PLL or frequency synthesizer used. A further advantage of the proposed approach resides in reprogrammability, since values and algorithms are not hard coded into the logic circuits. Finally, the arrangement disclosed herein significantly facilitates test stimuli generation.

Without prejudice to the underlying principle of the invention, the details and embodiment may vary, also significantly, with respect to what has been discussed just by way of example without departing from the scope of the invention, as defined by the claims that follow.

That which is claimed is:

1. A. built-in self-test circuit for a phase locked loop comprising:
   a measurement counter for measuring an output of the phase locked loop and receiving as inputs a plurality of external test signals; and
   at least one module comprising
      a scan chain for storing the external test signals for programming the phase locked loop and said measurement counter, and
      a controller module comprising a plurality of second scan chains for programming timing of the phase locked loop, said controller module comprising a synchronous counter for supplying a strobe signal and an enabling signal for enabling measurement of said measurement counter.

2. A built-in self-test circuit according to claim 1, wherein said at least one module comprises a plurality of registers connected together for forming the scan chain.

3. A built-in self-test circuit according to claim 2, further comprising a signature bus connected to the output of the phase locked loop, to an input of said at least one module, and to an output of said measurement counter.

4. A built-in self-test circuit according to claim 3, wherein said plurality of registers receive a capture signature signal transmitted on said signature bus, the capture signature signal corresponding to data contained in said plurality of registers.

5. A built-in self-test circuit according to claim 4, wherein said plurality of registers comprise a plurality of multiple-input shift registers (MISRs) receiving the capture signature signal.

6. A built-in self-test circuit according to claim 1, further comprising:
   a temporary dummy module; and
   at least one temporary bus connecting said temporary dummy module to said controller module.

7. A built-in self-test circuit according to claim 6, further comprising a signature bus connected to the output of the phase locked loop, to an output of said at least one module, and to an output of said measurement counter; and wherein said temporary dummy module selects between pattern generation and signals on said signature bus.

8. An integrated circuit comprising:
a phase locked loop; and
a built-in self-test circuit for testing said phase locked loop and comprising
a measurement counter for measuring an output of said phase locked loop and receiving as inputs a plurality of external test signals,
a scan chain for storing the external test signals for programming the phase locked loop and said measurement counter, and
a controller module comprising a plurality of second scan chains for programming timing of said phase locked loop, said controller module comprising a synchronous counter for supplying a strobe signal and an enabling signal for enabling measurement of said measurement counter.

9. An integrated circuit according to claim 8, wherein said scan chain comprises a plurality of registers connected together.

10. An integrated circuit according to claim 8, further comprising a signature bus connected to an output of said phase locked loop, to an input of said scan chain, and to an output of said measurement counter.

11. An integrated circuit according to claim 10, wherein said scan chain receives a capture signature signal transmitted on said signature bus, the capture signature signal corresponding to data contained in said chain.

12. An integrated circuit according to claim 11, wherein said scan chain comprises a plurality of multiple-input shift registers (MISRs) receiving the capture signature signal.

13. An integrated circuit according to claim 8, further comprising:
a temporary dummy module; and
at least one temporary bus connecting said temporary dummy module to said controller module and to said scan chain.

14. An integrated circuit according to claim 13, further comprising a signature bus connected to an output of said phase locked loop, to an output of said scan chain, and to an output of said measurement counter; and wherein said temporary dummy module selects between pattern generation and signals on said signature bus.

15. A method for testing a phase locked loop using a built-in self-test circuit, the method comprising:
programming the phase locked loop by loading a scan chain in the phase locked loop from a scan registers module;
locking the phase locked loop by disabling the scan chain and operating a clock of the phase locked loop and a clock of a controller module for generating a strobe signal after n number of clock pulses;
operating the phase locked loop when the controller module generates the strobe signal by resetting the controller module and a measurement counter;
enabling the measurement counter to measure an output of the phase locked loop, then operating the phase locked loop for m clock pulses;
capturing a signature by disabling the measurement counter at an end of the m clock pulses, then in a next clock cycle, generating a capture signature signal and capturing the data inside the measurement counter defining the signature which also corresponds to the data in the scan registers module; and
unloading the signature by shifting out from the scan registers module the captured signature.

16. A method according to claim 15, wherein the built-in self-test circuit is controlled through a plurality of external test signals comprising a scan enabling signal sent to the scan registers module, to the controller module and to the measurement counter for disabling and enabling the scan.

17. A method according to claim 16, wherein the plurality of external test signals comprise a clock macro signal for operating the clock of the phase locked loop.

18. A method according to claim 16, wherein the plurality of external test signals comprise a measure enabling signal for enabling and disabling the measurement counter to measure an output of the phase locked loop.

19. A method according to claim 16, wherein the plurality of external test signals comprise an external clock signal for driving loading of the scan chain, for generating the capture signature signal and unloading of the signature.

20. A method according to claim 15, wherein the method is controlled by an automatic test pattern generator tool.

21. A method for testing a phase locked loop using a built-in self-test circuit, the method comprising:
measuring an output of the phase locked loop using a measurement counter and receiving as inputs a plurality of extertnal test signals; and
storing the external test signals in at least one module for programming the phase locked loop and the measurement counter, the at least one module comprising
a scan chain for storing the external test signals for programming the phase locked loop and the measurement counter, and
a controller module comprising a plurality of second scan chains for programming timing of the phase locked loop, the controller module comprising a synchronous counter for supplying a strobe signal and an enabling signal for enabling measurement of the measurement counter.

22. A method according to claim 21, wherein the at least one module comprises a plurality of registers.

23. A method according to claim 22, wherein the built-in self-test circuit further comprises a signature bus connected to the output of the phase locked loop, to an input of the at least one module, and to an output of the measurement counter.

24. A method according to claim 23, wherein the plurality of registers receive a capture signature signal transmitted on the signature bus, the capture signature signal corresponding to data contained in the plurality of registers.

25. A method according to claim 24, wherein the plurality of registers comprise a plurality of multiple-input shift registers (MISRs) receiving the capture signature signal.

26. A computer-readable medium having stored thereon computer-executable instructions for testing a phase locked loop using a built-in self-test circuit, the computer-executable instructions for causing the built-in self-test circuit to perform steps comprising:
programming the phase locked loop by loading a scan chain in the phase locked loop from a scan registers module;
locking the phase locked loop by disabling the scan chain and operating a clock of the phase locked loop and a clock of a controller module for generating a strobe signal after n number of clock pulses;

operating the phase locked loop when the controller module generates the strobe signal by resetting the controller module and a measurement counter;

enabling the measurement counter to measure an output of the phase locked loop, then operating the phase locked loop for m clock pulses;

capturing a signature by disabling the measurement counter at an end of the m clock pulses, then in a next clock cycle, generating a capture signature signal and capturing the data inside the measurement counter defining the signature which also corresponds to the data in the scan registers module; and unloading the signature by shifting out from the scan registers module the captured signature.

27. A computer-readable medium according to claim 26, wherein the built-in self-test circuit is controlled through a plurality of external test signals comprising a scan enabling signal sent to the scan registers module, to the controller module and to the measurement counter for disabling and enabling the scan.

28. A computer-readable medium according to claim 27, wherein the plurality of external test signals comprise a clock macro signal for operating the clock of the phase locked loop.

29. A computer-readable medium according to claim 27, wherein the plurality of external test signals comprise a measure enabling signal for enabling and disabling the measurement counter to measure an output of the phase locked loop.

30. A computer-readable medium according to claim 27, wherein the plurality of external test signals comprise an external clock signal for driving loading of the scan chain, for generating the capture signature signal and unloading of the signature.

31. A computer-readable medium according to claim 26, wherein the computer-readable medium is executed by an automatic test pattern generator tool.

\* \* \* \* \*

UNITED STATES PATENT AND TRADEMARK OFFICE
CERTIFICATE OF CORRECTION

PATENT NO. : 7,284,173 B2  Page 1 of 1
APPLICATION NO. : 10/841981
DATED : October 16, 2007
INVENTOR(S) : Napolitano It is certified that error appears in the above-identified patent and that said Letters Patent is hereby corrected as shown below:

Column 6, Line 2   Delete: "tS"
                   Insert: -- $t_s$ --

Column 6, Line 32  Delete: "A. built-in"
                   Insert: -- A built-in --

Column 8, Line 28  Delete: "extertnal"
                   Insert: -- external --

Column 9, Line 12  Delete: "and unloading the"
                   Insert: -- and
                               unloading the --

Signed and Sealed this

Twenty-fourth Day of June, 2008

JON W. DUDAS
*Director of the United States Patent and Trademark Office*